United States Patent [19]

Mitsutsuka

[11] Patent Number: 5,043,620

[45] Date of Patent: Aug. 27, 1991

[54] SURFACE ACOUSTIC WAVE CONVOLVER AND CONVOLUTION INTEGRATOR USING SAME

[75] Inventor: Syuichi Mitsutsuka, Tokyo, Japan

[73] Assignee: Clarion Co., Ltd., Tokyo, Japan

[21] Appl. No.: 528,949

[22] Filed: May 25, 1990

[30] Foreign Application Priority Data

Jun. 2, 1989 [JP] Japan .................................. 1-140887

[51] Int. Cl.[5] .............................................. H01L 41/08

[52] U.S. Cl. ........................... 310/313 D; 310/313 R; 333/152; 333/153; 333/195; 364/821

[58] Field of Search ........................ 310/313 D, 313 R; 333/152, 153, 195; 364/821

[56] References Cited

U.S. PATENT DOCUMENTS

| | | | |
|---|---|---|---|
| 3,862,431 | 1/1975 | Quate et al. | 310/313 R |
| 4,365,216 | 12/1982 | Minagawa et al. | 333/153 |
| 4,599,532 | 7/1986 | Okamoto et al. | 310/313 D |
| 4,683,395 | 7/1987 | Mitsutsuka | 333/152 |
| 4,894,576 | 1/1990 | Okamoto et al. | 362/821 |
| 4,900,969 | 2/1990 | Mitsutsuka et al. | 364/821 |

FOREIGN PATENT DOCUMENTS

| | | | |
|---|---|---|---|
| 0144610 | 6/1988 | Japan | 333/152 |

OTHER PUBLICATIONS

"Monolithic (ZnO) Sezawa-Mode pn-Diode-Array Memory Correlator", F. C. Lo et al., Appl. Phys. Lett. 34(11), Jun. 1, 1979, pp. 725-726.

*Primary Examiner*—Mark O. Budd
*Assistant Examiner*—Thomas M. Dougherty
*Attorney, Agent, or Firm*—Flynn, Thiel, Boutell & Tanis

[57] ABSTRACT

In an SAW convolver composed of a substrate having a multi-layered structure comprising at least a piezoelectric film, self convolution is suppressed by disposing a first and a second array electrode disposed between the gate electrode and a pair of input electrodes, respectively, each of which consists of a high impurity concentration semiconductor layer. Further a convolution integrator is constituted by using such a convolver.

11 Claims, 8 Drawing Sheets

SURFACE ACOUSTIC WAVE CONVOLVER AND CONVOLUTION INTEGRATOR USING SAME

FIELD OF THE INVENTION

The present invention relates to improvement of a convolution integrator using a surface acoustic wave convolver (hereinbelow called simply SAW convolver) as well as to improvement of an SAW convolver used therefor.

BACKGROUND OF THE INVENTION

FIG. 9 is a top view of a prior art SAW convolver of typical structure. In the figure, reference numeral 1 is a piezoelectric substrate or a piezoelectric film/insulator/semiconductor multi-layered substrate; 2 is a gate electrode; 3 is an interdigital electrode; 4 is an input terminal; 5 is an output terminal; and 6 is a sound absorber. The structure, in which a piezoelectric substrate is used, has a feature that, since the propagation loss of the surface acoustic wave propagating in the substrate is small and the frequency dispersion of the group velocity is also small, the gate electrode 2 can be long and therefore a convolution integration of long time width can be effected. On the other hand, the structure, in which a piezoelectric film/insulator/semiconductor multi-layered substrate is used, has a feature that the non-linearity constant of the substrate is great and therefore a high convolution efficiency can be obtained.

However, in the prior art structure indicated in FIG. 9, unnecessary signals called self convolution signals are produced apart from the convolution signal (convolution integration signal) between inputted signals through the two interdigital electrodes (hereinbelow abbreviated to I.D.T). A self convolution signal is a signal produced by the fact that a surface acoustic wave generated by an I.D.T is reflected by the other I.D.T opposite thereto. FIG. 10 shows this aspect. In the figure, surface acoustic waves S1 and S2 are generated by electric signals F1(t) and F2(t) applied to the respective I.D.Ts and these surface acoustic waves are reflected by the other I.D.Ts, which gives rise to reflected waves S1r and S2r. In this case, it will be obvious that a convolution signal between S1 and its reflected wave S1r and that between S2 and its reflected wave S2r are also produced apart from the aimed convolution signal between S1 and S2. The former two signals S1r and S2r are self convolution signals. In this case, the output signal C(t) obtained at the output electrode 2 is expressed by the following formula;

$$C(t) = K\int_{t-T}^{t} F_1(\tau)F_2(2t - T - \tau)d\tau + K\cdot\Gamma\cdot e^{-\alpha L}K\int_{t-T}^{t} F_1(\tau)F_1(2t - 2T - \tau)d\tau + K\cdot\Gamma\cdot e^{-\alpha L}K\int_{t-T}^{t} F_2(\tau)F_2(2t - 2T - \tau)d\tau$$

t denotes the time; L the gate length; v the propagation velocity of the surface acoustic wave; K a constant; T is a reflection coefficient of the surface acoustic wave at the I.D.T; and α the attenuation constant of the surface acoustic wave.

Further, as expressed by Equation (2), T corresponds to the in-gate delay time. In Equation (1), the first term represents the convolution signal between the input signals F1(t) and F2(t). The second and third terms are terms which do not exist, in the case where there exist no reflected waves, and represent self convolution signals.

Now such self convolution signals appear as spurious noise for the output of the convolver and give undesirable influences that they decrease the dynamic range of the convolver. As an example, the output signal, when the input signals F1(t) and F2(t) expressed Equations (3) and (4), respectively, are inputted, is shown qualitatively in FIG. 11.

$$F_1(t) = \begin{cases} f(t)\cos(\omega t), (0 \leqq t \leqq T) \\ 0 \end{cases}, \text{(for other } t\text{)} \quad (3)$$

$$F_2(T) - t = \begin{cases} f(t)\cos(\omega t), (0 \leqq t \leqq T) \\ 0 \end{cases}, \text{(for other } t\text{)} \quad (4)$$

In FIG. 11 is shown the aspect that self convolution signals appear other than the convolution signal, which raises the spurious level L. When the spurious level is so remarkably raised, it can be a serious problem, when the SAW convolver is applied. For example, in the case where the SAW convolver is applied to a spread spectrum communication apparatus (hereinbelow called simply SS communication apparatus), the rise of the spurious level as described above increases the rate of errors at the data reception, which decreases effectively the date transfer speed or reduces the distance, for which the communication is possible.

In order to reduce the influences of the self convolution signal as described above, heretofore various methods have been proposed. As such a method, there is known a method, by which e.g. a dual gate convolver (refer to Literature 1) or a one-directional transducer (refer to Literature 2) is used.

Literature 1

I. Yao, "High-performance elastic convolver with parabolic horns", Proc. 1980 IEEE Ultrason. Symp., 1980, pp37-42

Literature 2

C. L. West, "SAW convolver employing unidirectional transducers for improved efficiency.," Proc. 1982 IEEE Ultrason. Symp., 1982, pp119-123

However the former method has a drawback that the area of an element is large and that the external circuit is complicated. On the other hand, the latter method has a drawback that the area of an element is similarly great and that it is difficult to enlarge the frequency band.

Further the inventor of the present invention has proposed in Japanese patent application No. 62-94490 (JP-A-63-260313) a method, by which, in a convolver using a piezoelectric film/insulator/semiconductor multi-layered substrate, auxiliary electrodes are disposed on the piezoelectric film between the gate electrode and the I.D.Ts and the self convolution signal is suppressed by applying such a bias voltage to the auxiliary electrodes that the semiconductor layer under the auxiliary electrodes is in an inverted state.

The method described above has a feature that the self convolution can be suppressed by a simple external circuit. However it has a drawback that since the portions, where the auxiliary electrodes are disposed, constitute loss sources, it is inevitable that the convolution efficiency as the whole is lowered.

OBJECT OF THE INVENTION

The object of the present invention is to provide a method for suppressing the influences of the self convolution signal in a convolution integrator using an SAW convolver and an efficient structure of the SAW convolver used therefor.

SUMMARY OF THE INVENTION

In order to achieve the above object, a first invention is characterized in that an SAW convolver comprises a multi-layered substrate consisting of a piezoelectric film/an insulating layer/a first conductivity type semiconductor epitaxial layer / a first conductivity type high impurity concentration semiconductor layer; a pair of input electrodes disposed with a predetermined distance on the piezoelectric film; a gate electrode for taking out a convolution output disposed on a propagation path of surface acoustic wave on the piezoelectric film between the pair of input electrodes; a first array electrode disposed under the insulating layer between the gate electrode and one of the input electrodes and consisting of a second conductivity type high impurity concentration semiconductor layer; and a second array electrode disposed under the insulating layer between the gate electrode and the other of the input electrodes and consisting of a second conductivity type high impurity concentration semiconductor layer.

A second invention is characterized in that an SAW convolver comprises a multi-layered substrate consisting of a piezoelectric film/an insulating layer/a first conductivity type semiconductor epitaxial layer/a first conductivity type high impurity concentration semiconductor layer; a pair of input electrodes disposed with a predetermined distance on the piezoelectric film; a gate electrode for taking out a convolution output disposed on a propagation path of SAW on the piezoelectric film between the pair of input electrodes; a first auxiliary electrode disposed on the piezoelectric film between the gate electrode and one of the input electrodes; a second auxiliary electrode disposed on the piezoelectric film between the gate electrode and the other of the input electrodes; and a first and a second array electrode disposed under the insulating layer under the respective auxiliary electrodes and consisting of second conductivity type high impurity concentration semiconductor layers.

A third invention is characterized in that a convolution integrator comprises an SAW convolver consisting of a substrate including at least a piezoelectric film; a pair of input electrodes disposed with a predetermined distance on the piezoelectric film; a gate electrode for taking out a convolution output disposed on a propagation path of surface acoustic wave on the piezoelectric film between the pair of input electrodes; and loss controlling means for controlling propagation loss of the SAW by electric signals, disposed on the piezoelectric film between the gate electrode and each of the input electrodes; and synchronizing means, which makes the loss controlling means change from a state where the loss is great to a state where the loss is small at the same time as the beginning point of the input signal and return again to the state where the loss is great, after a period of time of T+Td has lapsed; T denoting the in-gate delay time, Td the delay time required for the SAW to reach the closest end of the gate electrode, starting from the input electrodes; the beginning point of the reference input signal being synchronized with beginning point of the input signal.

A fourth invention is characterized in that a convolution integrator comprises an SAW convolver consisting of a multi-layered substrate consisting of a piezoelectric film/an insulating layer/a semiconductor layer; a pair of input electrodes disposed with a predetermined distance on the piezoelectric film; a gate electrode for taking out a convolution output disposed on a propagation path of surface acoustic wave on the piezoelectric film between the pair of input electrodes; and loss controlling means for controlling propagation loss of the SAW by electric signals, disposed on the piezoelectric film between the gate electrode and each of the input electrodes; and synchronizing means, which makes the loss controlling means change from a state where the loss is great to a state where the loss is small at the same time as the beginning point of the input signal and return again to the state where the loss is great, after a period of time of T+Td has lapsed; T denoting the in-gate delay time, Td the delay time required for the SAW to reach the closest end of the gate electrode, starting from the input electrodes; the beginning point of the reference input signal being synchronized with beginning point of the input signal.

A fifth invention is characterized in that a convolution integrator comprises an SAW convolver consisting of a multi-layered substrate consisting of a piezoelectric film/an insulating layer/a first conductivity type semiconductor epitaxial layer / a first conductivity type high impurity concentration semiconductor layer; a pair of input electrodes disposed with a predetermined distance on the piezoelectric film; a gate electrode for taking out a convolution output disposed on a propagation path of surface acoustic wave on the piezoelectric film between the pair of input electrodes; an auxiliary electrode disposed on the piezoelectric film between the gate electrode and each of the input electrodes; and an array electrode disposed under the insulating layer under each of the auxiliary electrodes; bias supplying means for applying a bias voltage to the auxiliary electrodes; synchronizing means, which makes the auxiliary electrodes change from a state where the loss is great to a state where the loss is small at the same time as the beginning point of the input signal and return again to the state where the loss is great, after a period of time of T+Td has lapsed; T denoting the in-gate delay time, Td the delay time required for the SAW to reach the closest end of the gate electrode, starting from the input electrodes; the beginning point of the reference input signal being synchronized with beginning point of the input signal.

A sixth invention is characterized in that a convolution integrator comprises an SAW convolver consisting of a multi-layered substrate consisting of a piezoelectric film/an insulating layer/a semiconductor layer; a pair of input electrodes disposed with a predetermined distance on the piezoelectric film; a gate electrode for taking out a convolution output disposed on a propagation path of surface acoustic wave on the piezoelectric film between the pair of input electrodes; and loss controlling means for controlling propagation loss of the SAW by electric signals, disposed on the piezoelectric film between the gate electrode and each of the input electrodes; further a gate circuit inserted on the input side of each of the input electrodes; and synchronizing means for controlling the state of array electrodes and the gate circuits with respect to the input signal and the reference input signal to synchronizing them; wherein T denoting the in-gate delay time, Td the delay time required for the SAW to reach the closest end of the gate electrode, starting from the input electrodes, when the input signal and the reference input signal are repeated signals having a period of T, the synchronizing means effects synchronizing control so that (i) the beginning of the period of the input signal, the beginning of the period of the reference signal, and the point of time of the change of the state of opening or closing of the gate circuit are synchronized;

(ii) the opening and closing of the gate circuit repeats the change of the state with a period of 2T, the gate circuit being in the opened state during a time width T, which is a half of one period, and in the closed state during the remaining time;

(iii) the state of the loss by the array electrodes repeats also the change of state with a period of 2T, it being in the state, where the loss is small, during a time width of T+Td and in the state, where the loss is great, during the remaining time width; and (iv) the point of time where the array electrodes are changed from the state, where the loss is great, to the state, where the loss is small, is synchronized with the point of time, where the gate circuit is changed from the closed state to the opened state.

The loss controlling section of the SAW convolver is controlled to be synchronized, depending on the state of the input signal and the reference signal, or the input signal, the reference signal as well as the opening and the closing of the gate circuit are controlled to be synchronized. Or the propagation loss of the SAW is controlled by the voltage applied to the first and the second array electrode.

Since the influences of the self convolution signal are suppressed in this way, the spurious noise level is lowered.

DETAILED DESCRIPTION

Figure 1:
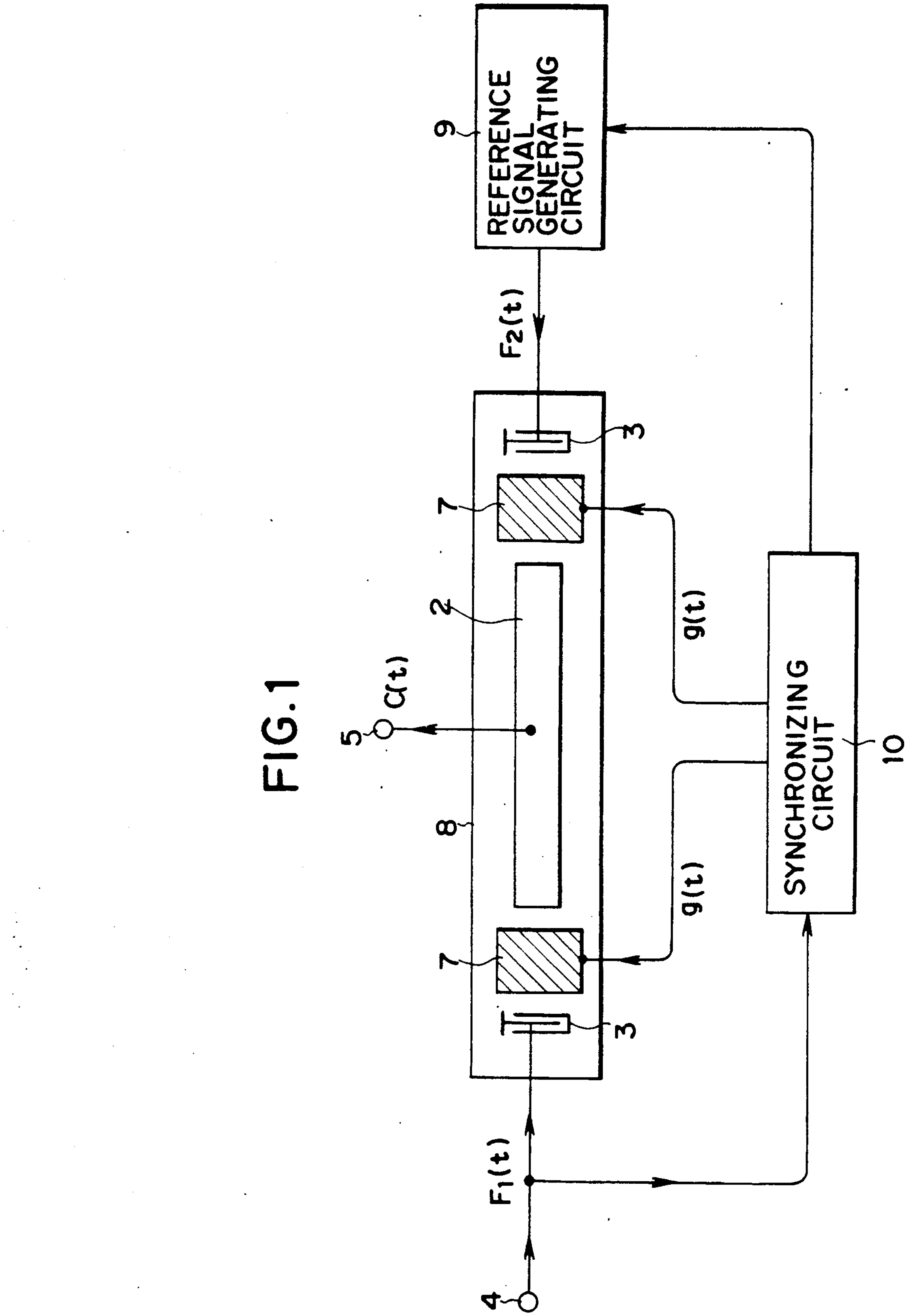
FIG. 1 is a block diagram indicating the basic construction of the present invention.

Hereinbelow the embodiments indicated in the drawings will be explained.

At first, the basic construction according to the present invention for suppressing the self convolution signal is indicated in FIG. 1. This figure indicates the construction, in the case where, between the signals inputted through the two I.D.Ts, respectively, one of the signals is the input signal F1(t), while the other is the reference signal F2(t), and the convolution integration of the two is executed. In the SAW convolver 8 indicated in FIG. 4, the reference numerals identical to those used in FIG. 12 indicate identical or similar thereto and it is provided apart therefrom with a synchronizing section 10.

That is, it consists of;

(a) an SAW convolver 8 having a structure, in which the loss controlling section 7 controlling the propagation loss of the surface acoustic wave by electric signals is disposed between the I.D.Ts 3 and the gate electrode 2; and (b) a synchronizing section for controlling the state of the loss controlling section 7 so as to synchronize the input signal with the reference signal.

Figure 2:
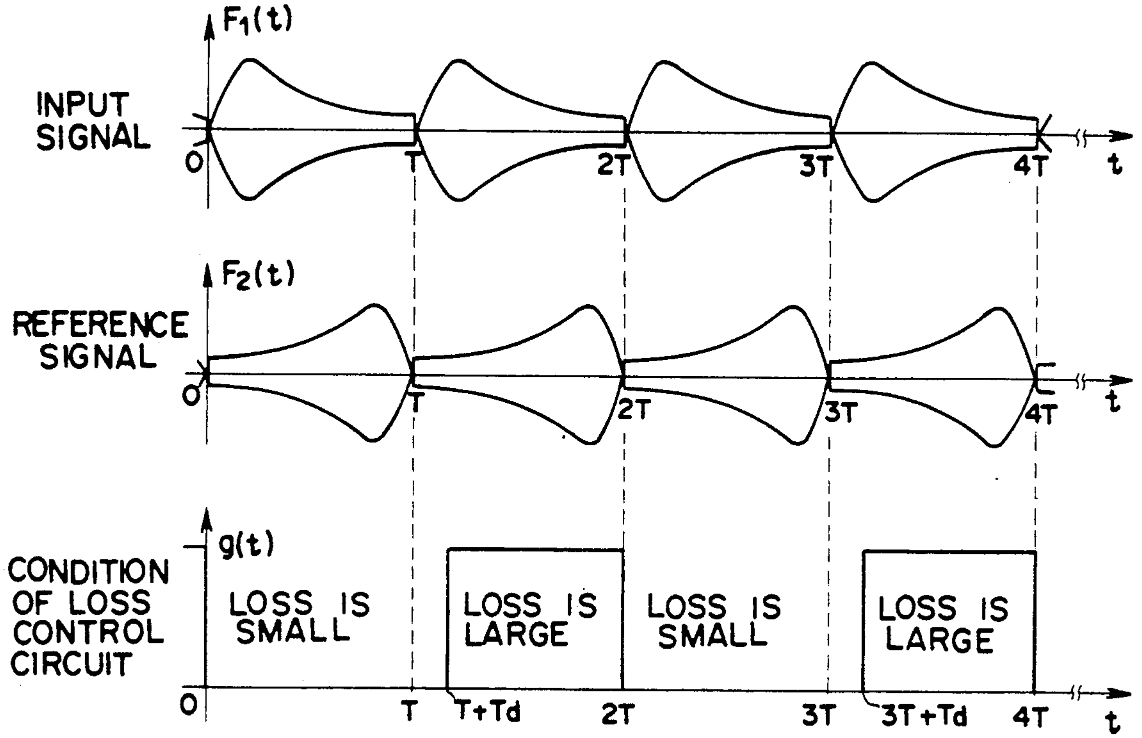
FIGS. 2 and 3 are schemes showing the control method of the synchronizing section indicated in FIG. 1.

When the input signal and the reference signal are repeating signals having a period T (T being an in-gate delay time), it is supposed that the synchronizing section 10 effects the control so that the signals and the states are as indicated in FIG. 2.

In FIG. 2;

(i) the beginning of the period of the input signal is synchronized with the beginning of the period of the reference signal;

(ii) the state of the loss in the loss controlling section 7 repeats the change of state with a period of 2T, and therebetween it is in the state, where the loss is small, during a time width T+Td, while it is in the state, where the loss is large, during the remaining time width, Td representing the time, which is necessary for the surface acoustic wave generated by an I.D.T to reach the closest end of the gate; and (iii) the point of time of the change of state of large loss →small loss is in accordance with the point of time of the beginning of the period of the input signal for every two periods (2T).

Figure 3:
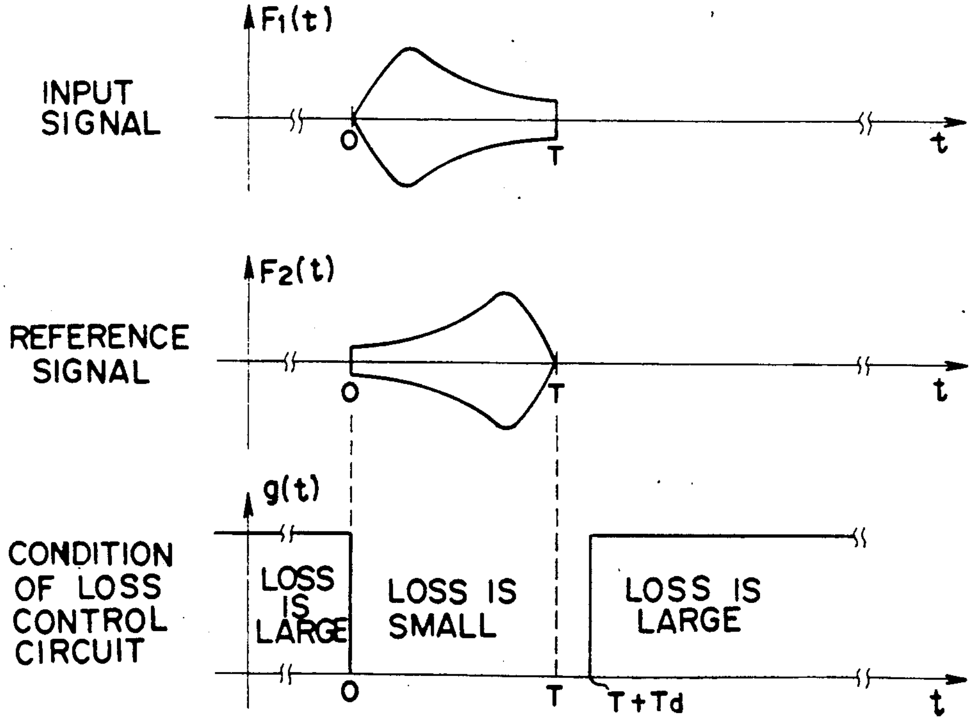

On the other hand, when the input signal and the reference signal are singly occurring phenomena, it is supposed that the synchronizing section 10 effects the control so that the signals and the states are as indicated in FIG. 3.

In FIG. 3;

(i) the beginning of the input signal is synchronized with the beginning of the reference signal; and (ii) the state of the loss in the loss controlling section 7 is in the statè, where the loss is small, at the point of time of the beginning described above and returns again to the state, where the loss is large, after having kept the state, where the loss is small, only during the time width of T+Td.

Although, in FIGS. 2 and 3, it is indicated that the loss is large, when the relation between the state of the loss controlling section 7 and the signal controlling the loss controlling section g(t) is represented by $g(t)>0$, and the loss is small, when $g(t)=0$, this is only one example for the sake of explanation and basically they may be in any relation, it g(t) and the state of the loss controlling section correspond to each other by 1 to 1.

Now, the loss controlling section 7 in the SAW convolver 8 indicated in FIG. 1 should have such characteristics that the propagation loss of the surface acoustic wave propagating therethrough is varied immediately depending on the control signal g(t), as indicated in FIGS. 2 and 3. In principle, it is possible to realize the construction of the present invention indicated in FIG. 1 by using the portion of the auxiliary electrodes in the construction as the loss controlling section in the convolver having the structure disclosed in the preceding patent application described above. However, by the construction disclosed in the preceding patent application, since it is a construction, in which the voltage is applied to the surface of the semiconductor body through the piezoelectric film and the oxide film, time is necessary for the generation and the recombination of minority carriers and variations in the amount of surface carriers (minority carriers cannot follow variations of the control signal voltage applied to the auxiliary electrodes). As the result, it is extremely difficult in practice to make the propagation loss of the surface acoustic wave propagating through the portion of the auxiliary electrodes immediately vary, responding to the control signal. Therefore, instead of realizing the construction indicated in FIG. 1 according to the present invention, it is more advantageous to use a convolver having a new construction described below.

Figure 4A:
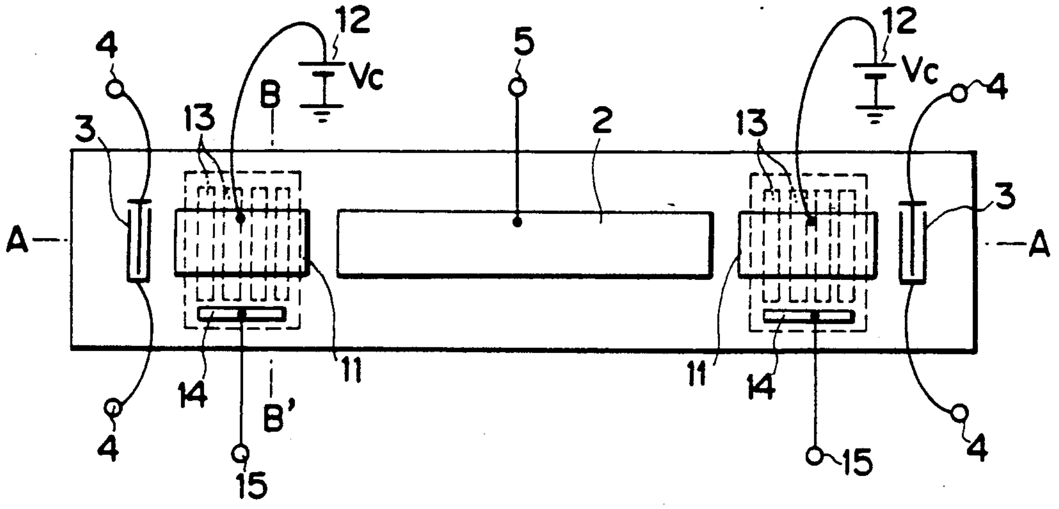
FIGS. 4A, 4B and 4C are a top view of an embodiment of the present invention, a cross sectional view along the line A—A′ in FIG. 4A and a cross sectional view along the line B—B′ in FIG. 4A, respectively.
Figure 4B:
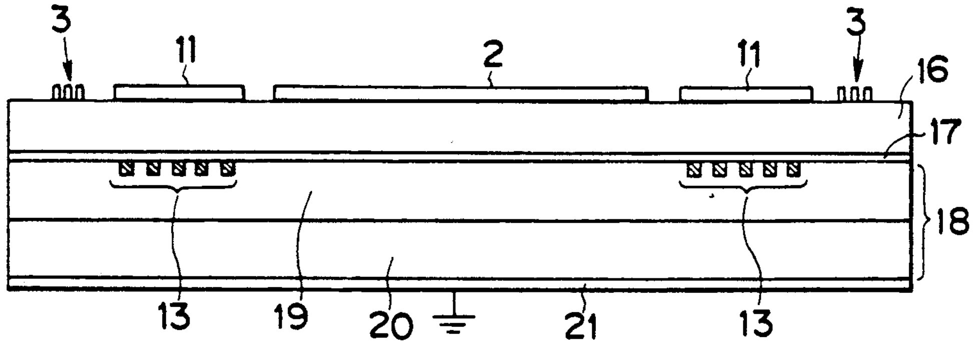
Figure 4C:
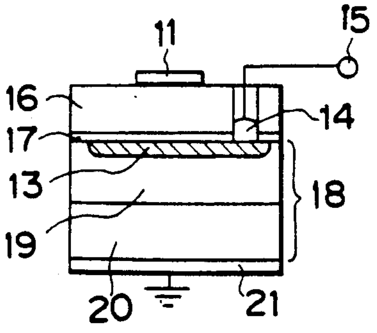
Figure 5A:
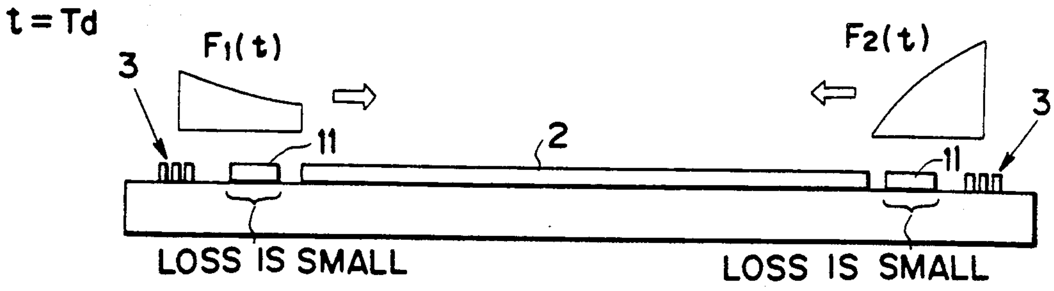
FIGS. 5A to 5D and 6 are schemes for explaining the operation of the embodiment described above.
Figure 5B:
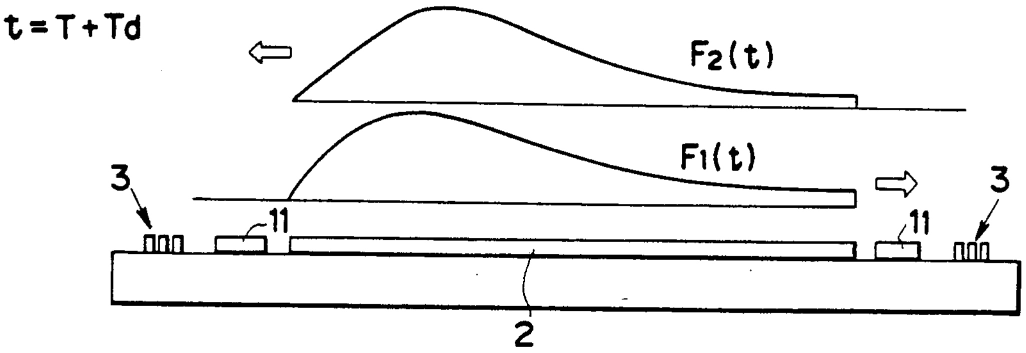
Figure 5C:
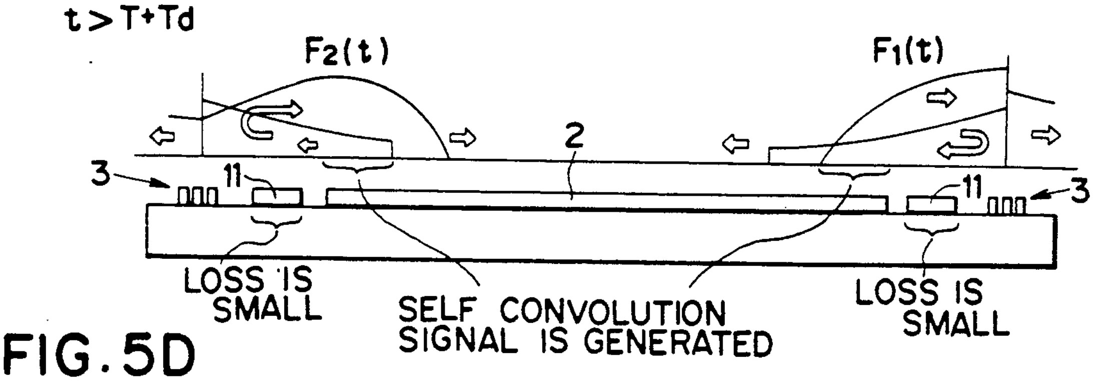
Figure 5D:
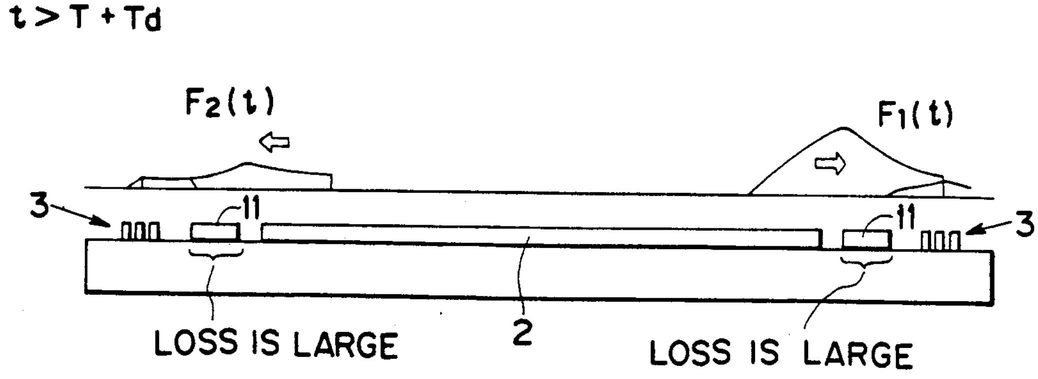

FIGS. 4A to 4C show the construction of an embodiment of the SAW convolver according to the present invention. This convolver is so constructed that a substrate having the structure of piezoelectric film/insulator/semiconductor is used; auxiliary electrodes 11 are disposed on the piezoelectric film between the gate electrode 2 and the respective interdigital electrodes 3; and further there are disposed array electrodes 13 composed of semiconductor layers of conductivity type opposite to the conductivity type of the epitaxial layer on the semiconductor epitaxial layer 19 at the same positions. In this construction, in addition to the construction disclosed in the preceding patent application described previously, there are disposed the array electrodes 13. In FIGS. 4A to 4C, it is supposed that the semiconductor body 18 has a construction $n/n^+$ or $p/p^+$. The reference numerals same as those used in FIG. 1 represent the parts identical or similar thereto and in addition thereto reference numeral 11 is an auxiliary electrode; 12 is a DC power supply; 13 is a $p^+$ type semiconductor (or $n^+$ type semiconductor) layer; 14 is a control electrode; 15 is a control terminal; 16 is a piezoelectric film; 17 is an insulating layer; 18 is a semiconductor body; 19 is an n type semiconductor epitaxial layer (p type semiconductor epitaxial layer); 20 is an $n^+$ type semiconductor substrate ($p^+$ type semiconductor substrate); and 21 is a rear side electrode. In this case, it is supposed that the array electrode 13 is composed of ($p^+$ type semiconductor, when the semiconductor body has the $n/n^+$ construction, and on the contrary $n^+$ type semiconductor, when the semiconductor body has the $p/p^+$ construction. Such an array electrode 13 can be easily formed by impurity diffusion or ion implantation. The piezoelectric film, the insulating layer, the semiconductor body and the various electrodes may be made of various kind of materials. For example, ZnO and AlN may be used for the piezoelectric film; $SiO_2$ and SiNx for the insulating layer; and Si, GaAs, etc. for the semiconductor body. Further Al, Al/Ti, Au, etc. may be used for the various electrodes. When the convolver indicated in FIGS. 4A to 4C is driven, a DC voltage is applied to the auxiliary electrodes 11. In addition, the control voltage is applied to the control terminal 15 to control the voltage applied to the array electrode 13. At this time the propagation loss of the surface acoustic wave propagating through the portion of the auxiliary electrodes is determined, depending on the value of the control voltage applied to the control terminal 15, and in addition, when the voltage is varied, it varies immediately, responding thereto (the reason will be described later). Consequently, if the propagation loss of the surface acoustic wave is controlled by using the voltage applied to the control terminal 15 as the control signal, it is possible to utilize the convolver indicated in FIGS. 4A to 4C for the convolver necessary for the construction indicated in FIG. 1.

Now the operation of the present invention.

Figure 11:
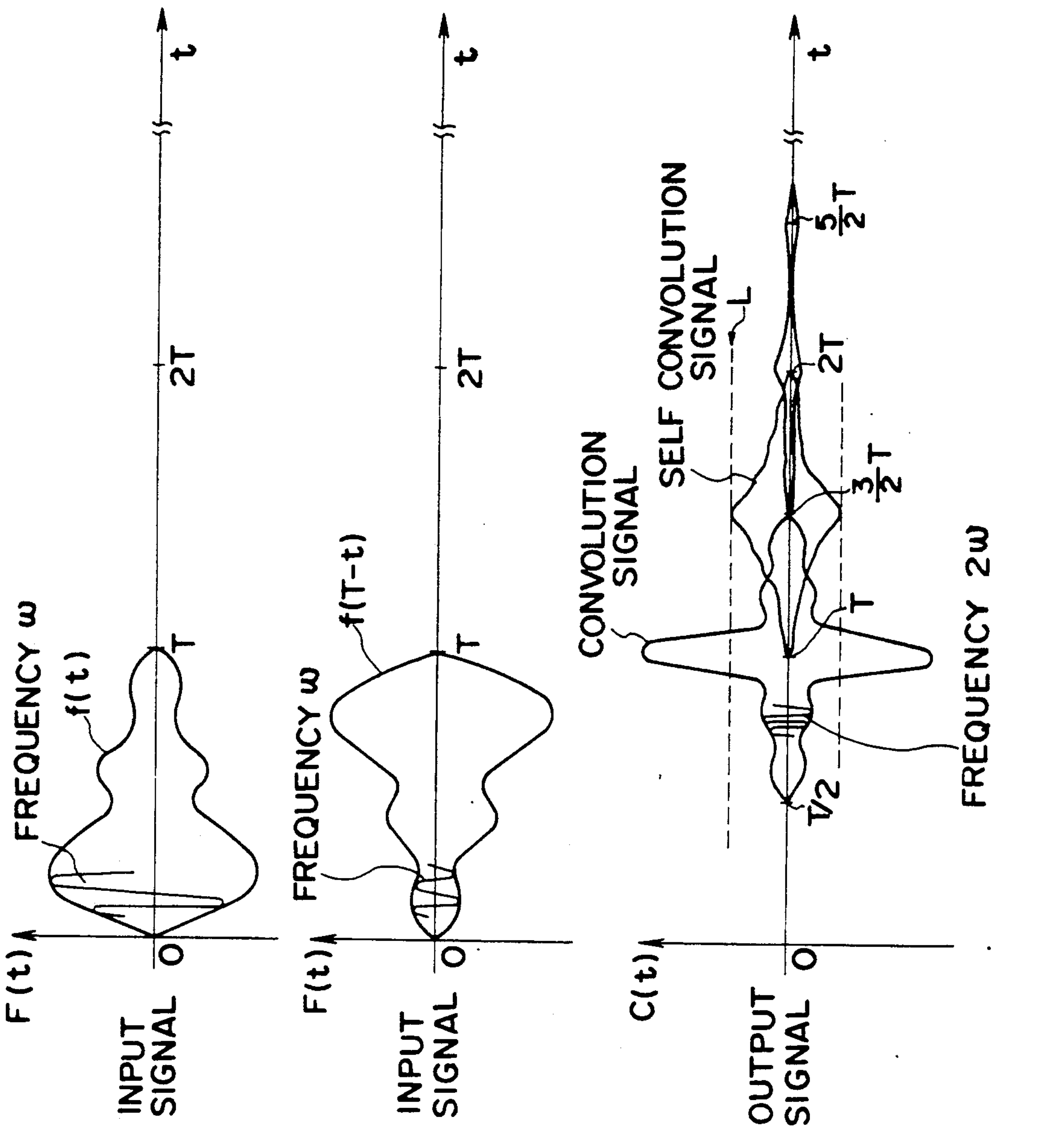
FIG. 11 shows waveforms of the input and the output signal in and from the SAW convolver indicated in FIG. 9.

At first, the reason why the self convolution signal can be suppressed by the construction indicated in FIG. 1 will be explained. The basic working principle will be explained for the case of the singly occurring signal (having a time width T) as indicated in FIGS. 11 and 3. FIGS. 5A to 5D show qualitatively how the amplitude of the surface acoustic wave on the convolver varies at points of time $t=Td$, $t=T+Td$ and $t>T+Td$ after the signals F1(t) and F2(t) have been applied to the I.D.Ts at a point of time $t=0$. As it can be seen, comparing FIG. 5C with FIG. 5D, if the loss in the loss controlling section 7 is large for $t>T+Td$, it is possible to suppress the self convolution signal. This is due to the fact that wave reflected by the interdigital electrodes is small owing to the loss in the loss control section. This point will be clear from FIGS. 5A to 5D. Further it is for leading the input signal having a time width T to the gate electrode without decreasing the amplitude as far as possible that the loss in the loss controlling section 7 is kept to be small at $0 \leq t \leq T+Td$. This point also will be clear from FIGS. 5A to 5D. This is the reason why, in the construction indicated in FIG. 1 according to the present invention, the control as indicated in FIG. 3 is effected in the case where a singly occurring signal having a time width T is inputted. On the other hand, it is a reason basically identical to that explained, referring to FIGS. 5A to 5D, why, in the construction indicated in FIG. 1, the control as indicated in FIG. 2 is effected, when the input signal is a repeating signal having a period T. However, at the point of time, where the loss in the loss controlling section 7 is set at a state where it is large, both the input signal and the reference signal inputted in the interdigital electrodes 3 are subjected to attenuation and the convolution signal thereof cannot be obtained. In order to shorten such insensitive period of time as far as possible and in addition to suppress surely the self convolution signal, it is sufficient to make the state of the loss controlling section 7 vary with a period 2T, as indicated in FIG. 2. At this time, similarly to the timing indicated in FIG. 3, the point of time of the change of state of large loss →small loss should be in accordance with the point of time of the beginning of the input signal. In FIG. 2, the convolution output corresponding to one period (T) of the input signal inputted during the period of time, where the loss is small, and the reference signal is outputted with a period 2T. This is the working principle of the construction indicated in FIG. 1. Further, by the construction indicated in FIG. 1, since, comparing it with the method disclosed in the preceding patent application described above, the loss in the loss controlling section 7 is varied in time so that the loss is small at the point of time, where the input signal is inputted, an advantage is obtained that the self convolution signal is suppressed and at the same time the convolution efficiency is not decreased.

Next, the reason will be explained why, in a convolver having the construction indicated in FIG. 4A to 4C, the propagation loss of the surface acoustic wave propagating through the portion of the auxiliary electrodes is determined, depending on the voltage applied to the control terminal and in addition, when the voltage is varied, it varies immediately, responding thereto. In the multi-layered structure of piezoelectric film/insulator/semiconductor such as the substrate indicated in FIGS. 4A to 4C, the propagation loss of the surface acoustic wave propagating through this structure depends on the state of the surface of the semiconductor body. When the surface of the semiconductor body is in the depletion state or in the storage state, the propagation loss is small. On the other hand, when it is in the inverted state and minority carriers are collected in the surface portion of the semiconductor body. For the detail concerning this point, refer to e.g. following Literature 3;

Literature 3

S. Mitsutsuka et al. "Propagation loss of surface acoustic waves on a monolithic metal-insulator-semiconductor structure" Journal of Applied Physics, Vol. 65, No. 2, Jan. 15, 1989 pp651-661

Figure 6:
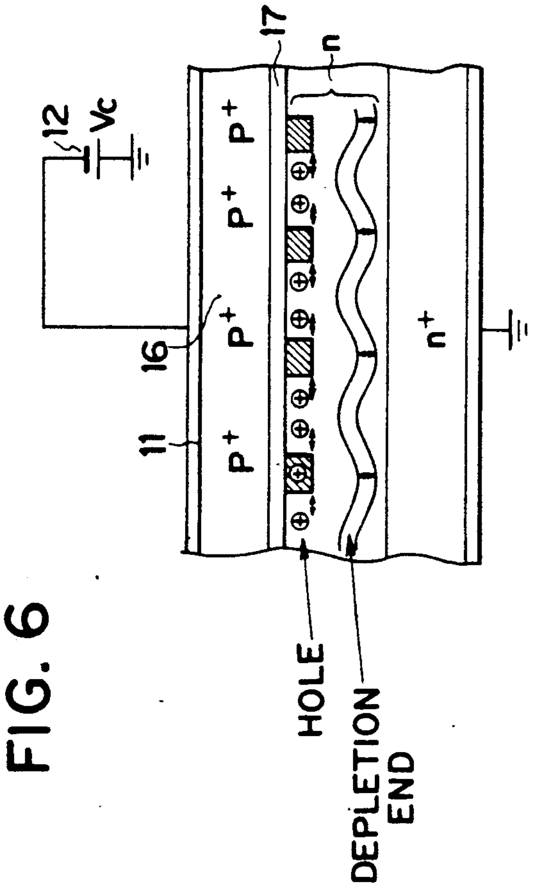

Consequently, if the surface state of the semiconductor body is controlled by some method, it is possible to control the propagation loss of the surface acoustic wave. In the embodiment indicated in FIGS. 4A to 4C according to the present invention this is effected by means of the auxiliary electrodes 11 and the array electrodes 13. In the construction disclosed in the preceding patent application described previously the surface state of the semiconductor body is effected only by the auxiliary electrodes 11. Such a construction using only the auxiliary electrodes is useful for applications, in which the element is driven while keeping the propagation loss of the surface acoustic wave at a constant value. However, in the case where it is desired to vary the propagation loss of the surface acoustic wave with a high speed in time, it is extremely difficult to realize it by the construction using only the auxiliary electrodes 11. This is due to the fact that, in such a construction, the speed of variations in the quantity of minority carriers at the surface of the semiconductor body is determined by the time necessary for the generation and the recombination of the minority carriers and as the result variations in the quantity of minority carriers cannot follow variations in the voltage applied to the auxiliary electrodes. On the contrary, in the construction indicated in FIGS. 4A to 4C according to the present invention, there are disposed the array electrodes 13 in addition to the auxiliary electrodes 11, to which a constant DC bias voltage (Vc) is applied, and a control voltage is applied to the array electrodes 13 so that the propagation loss of the surface acoustic wave can be controlled by the control voltage. In this case, the array electrodes 13 is formed by a semiconductor layer of conductivity type opposite to the conductivity type of the semiconductor epitaxial layer 19. At this time each of the array electrodes 13 forms a pn junction with the epitaxial layer 19. In such a case, minority carriers (minority carriers for the epitaxial layer) are injected or drawn out directly from the array electrodes 13. For this reason the quantity of the minority carriers is controlled by the voltage applied to the array electrodes 13 and further, when the voltage is varied, the quantity of the minority carriers is varied immediately, responding thereto. Still further the width of the depletion layer is varied immediately, responding to variations in the voltage stated above. This aspect is shown in FIG. 6, as an example, for the case where the epitaxial layer 19 is of n type and the array electrodes 13 are of $p^+$ type. In the figure, 11 is an auxiliary electrode; 12 is a DC power supply; 16 is a piezoelectric film; and 17 is an insulating layer. It is for the purpose of lowering the resistance of the electrodes so that the response speed is as high as possible that the impurity concentration in the array electrodes 13 is high. FIG. 6 shows the aspect how minority carriers (holes) are directly injected in or drawn-out from the n type epitaxial layer and the aspect how the width of the depletion layer varies. As described above, in the construction indicated in FIGS. 4A to 4C according to the present invention, since it is possible to control the quantity of minority carriers at the surface of the semiconductor body and the width of the depletion layer by the voltage applied to the array electrodes 13 and further a high speed control is possible, it is possible correspondingly to control also the propagation loss of the surface acoustic wave by the voltage described above. This is the working principle of the present invention indicated in FIGS. 4A to 4C. In this case, it is for the purpose of regulating the minimum or maximum value of the propagation loss of the surface acoustic wave, depending on the control voltage applied to the array electrodes 13 that the DC voltage Vc is applied to the array electrodes 13.

The various parts in the construction indicated in FIGS. 4A to 4C, as described above, may be made of different materials. However, in order to raise the convolution efficiency and in addition to increase the variable quantity in the propagation loss of the surface acoustic wave in the auxiliary electrode portion, it is desirable to use a construction and materials having a great electromechanical coupling constant. In this meaning, it is advantageous to use ZnO for the piezoelectric film, $SIO_2$ for the insulator, and Si for the semiconductor, and also it is advantageous that the propagation mode of the surface acoustic wave is Sezawa wave. In this case, it is particularly advantageous that the surface orientation of Si is (110) and the propagation direction of the surface acoustic wave is [100], because the electromechanical coupling constant is particularly great in this case. Since the electromechanical coupling constant is fairly great, when the surface orientation of Si is (100) and the propagation direction of the surface acoustic wave is [110], these are most advantageous next to the condition described above. Further, although constructions, in which there exists the insulator 17, have been shown in FIGS. 4A to 4C and in the above explanation, even if there exists no insulator, the basic operation is possible. In this case, the working principle is identical to that explained for the construction indicated in FIGS. 4A to 4C. However, in the meaning of stabilizing characteristics of the element, the construction, in which there exists an insulating layer, is more advantageous.

Figure 7:
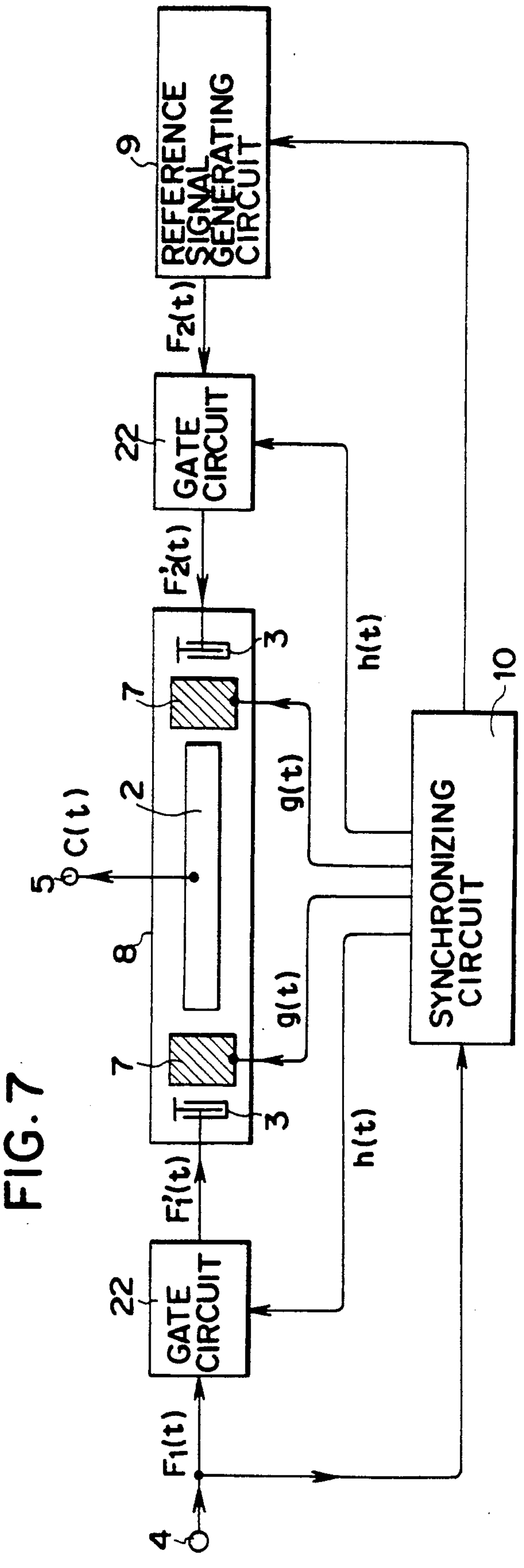
FIG. 7 is a block diagram showing another embodiment of the present invention.
Figure 8:
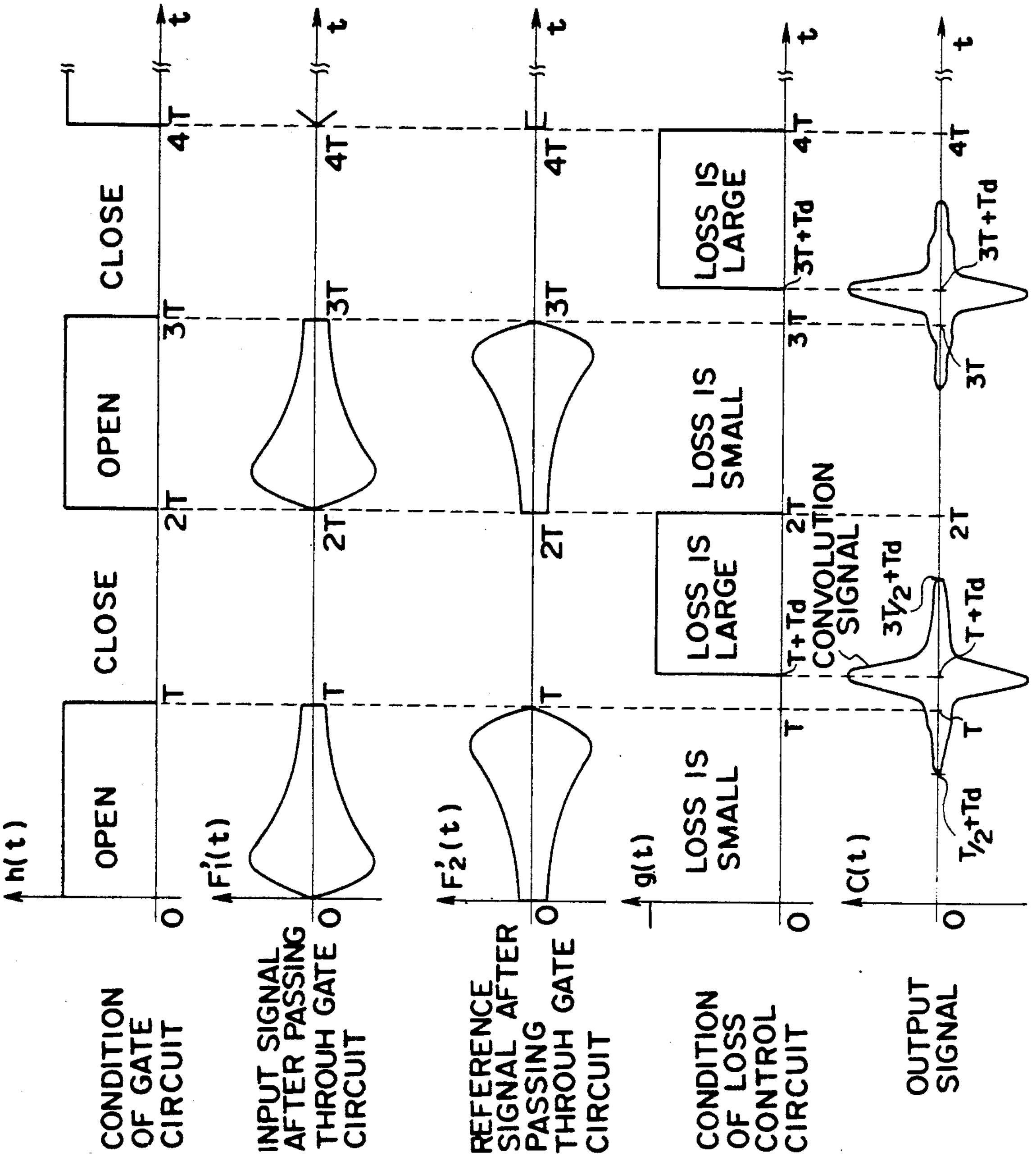
FIG. 8 is a scheme indicating the control method of the gate circuit in the above embodiment indicated in FIG. 7.
Figure 9:
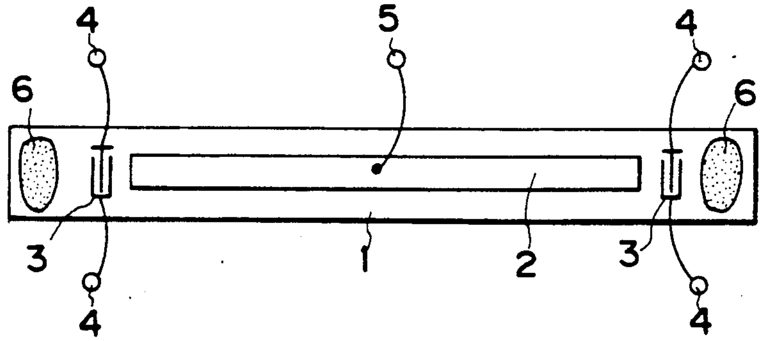
FIG. 9 PRIOR ART
FIG. 9 is a scheme illustrating a prior art SAW convolver.
Figure 10:
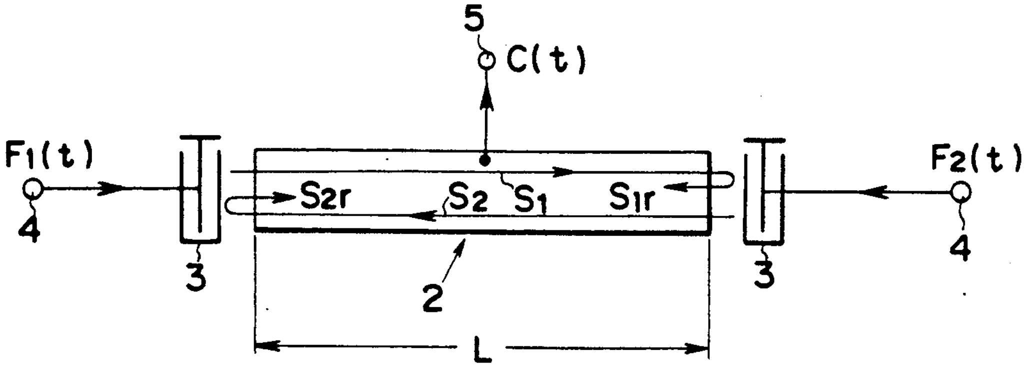
FIG. 10 PRIOR ART
FIG. 10 is a scheme for explaining the operation thereof.

Although, in the above, the construction indicated in FIG. 1 according to the present invention and construction in the embodiment indicated in FIGS. 4A to 4C according to the present invention have been explained, as a modification of the construction indicated in FIG. 1, that indicated in FIG. 7 is also possible. In the figure the same reference numerals as those used also in FIG. 1 represent identical or similar parts. Further, compared with FIG. 1, it is characterized in that a gate circuit 22 is disposed in the stage preceding each of the interdigital electrodes 3. The gate circuit 22 is a circuit, which makes RF signals pass through or cuts off them. Concretely speaking, it can be realized by using a mixer and an analogue switch. It is supposed that the timing of the opening and closing of the gate circuit 22 and the timing of the change of state of the loss controlling section 7 are as indicated in FIG. 8 and that the synchronizing section 10 controls such timings. FIG. 7 shows a construction, which is useful for the case where the input signal and the reference signal are repeating signals having a period T (T denoting the in-gate delay time) and FIG. 8 indicates the timing for the case of such a repeating signal. FIG. 8 is a modified example of FIG. 1, which represents the following features of the operation.

(i) The beginning of the period of the input signal, the beginning of the period of the reference signal, and the point of time of the change of the state of opening and closing of the gate circuit 22 are synchronized.

(ii) The opening and closing of the gate circuit 22 repeats the change of the state with a period of 2T. The gate circuit is in the opened state during a time width T, which is a half of one period, and in the closed state during the remaining time.

(iii) The loss controlling section 7 repeats the state of the loss also with a period of 2T. It is in the state, where the loss is small, during a time width of T+Td and in the state, where the loss is great, during the remaining time width (Td denoting the time necessary for the surface acoustic wave going out from each of the I.D.Ts 3 to reach the closest end of the gate).

(iv) The point of time of the change of state of large loss →small loss and the point of time of the change of state of open →close of the gate circuit are in accordance with each other.

Here the opened state of the gate circuit 22 means a state, where high frequency (RF) signals pass therethrough, and the closed state a state, where the RF signals are cut off.

The advantage of using the construction as indicated in FIG. 7 to effect the timing control as described above consists in that, for the case of the repeating signal, the spurious noise level can be lowered with respect to the construction indicated in FIG. 1.

In the case where the construction indicated in FIG. 1 and the timing control as indicated in FIG. 2 is effected, on the gate circuit 22 there can exist not only the input signal and the reference signal, which are in time regions $0\leqq t<T$, $2T\leqq t<3T$, - - -, but also signals, which are in time regions $T\leqq T<2T$, $3T\leqq t<4T$, - - -. This is because it is usually impossible to attenuate completely the surface acoustic wave, even if the loss in the loss controlling section 7 is increase (which has, however, a satisfactory effect of suppressing the self convolution signal). In such a case, a part of the signals in the time regions $T\leqq t<2T$, $3T\leqq t<4T$, - - - interacts with the convolution signal of the input signal and the reference signal in the time regions $0\leqq t<T$, $2T\leqq t<3T$, - - -, which can give rise to spurious signals. On the contrary, in the case where the construction indicated in FIG. 7 is used and the timing control indicated in FIG. 8 is effected, since the signals in the time regions $T\leqq t<2T$, $3T\leqq t<4T$ are cut off by the gate circuit 22, there are no problems as described above and therefore it is possible to reduce more remarkably the spurious noise than the construction indicated in FIG. 1.

g(t) in FIGS. 1, 3 and 8 represents an example of the bias voltage. Further the element indicated in FIGS. 4A to 4C can be driven without the auxiliary electrodes 11 and the bias source 12. Still further it can be driven only with the auxiliary electrodes without any array electrodes (the auxiliary electrodes being controlled by the synchronizing section).

As explained above, according to the present invention, in an SAW convolver and a convolution integrator using same, since influences of the self convolution signal are suppressed, it is possible to lower the spurious level of the convolution signal.

Further the present invention can be widely applied to all sorts of apparatuses using SAW convolvers, e.g. a spread spectrum communication apparatus, a correlator, a radar, an image processing system, a Fourier transformer, etc.

What is claimed is:

1. A surface acoustic wave convolver comprising:
a multi-layered substrate which includes a piezoelectric film/an insulating layer/a first conductivity type semiconductor epitaxial layer/a first conductivity type high impurity concentration semiconductor layer;
a pair of input electrodes disposed with a predetermined distance on said piezoelectric film;
a gate electrode for taking out a convolution output disposed on a propagation path of surface acoustic wave on said piezoelectric film between said pair of input electrodes;
a first array electrode disposed under said insulating layer between said gate electrode and one of said input electrodes and including a second conductivity type high impurity concentration semiconductor layer; and
a second array electrode disposed under said insulating layer between said gate electrode and the other of said input electrodes and which includes a second conductivity type high impurity concentration semiconductor layer.

2. A surface acoustic wave convolver comprising:
a multi-layered substrate consisting of a piezoelectric film/an insulating layer/a first conductivity type semiconductor epitaxial layer/a first conductivity type high impurity concentration semiconductor layer;
a pair of input electrodes disposed with a predetermined distance on said piezoelectric film;
a gate electrode for taking out a convolution output disposed on a propagation path of surface acoustic wave on said piezoelectric film between said pair of input electrodes;
a first auxiliary electrode disposed on said piezoelectric film between said gate electrode and one of said input electrodes;
a second auxiliary electrode disposed on said piezoelectric film between said gate electrode and the other of said input electrodes; and
a first and a second array electrode disposed under said insulating layer under the respective auxiliary electrodes and consisting of second conductivity type high impurity concentration semiconductor layers.

3. A convolver according to claim 2, wherein each said array electrode has a plurality of portions which each engage a respective portion of said epitaxial layer so as to define a respective pn junction, and including means for facilitating application of a DC bias voltage to each of said auxiliary electrodes, and means for facilitating application of an input signal to a first of said input electrodes and application of a reference signal to a second of said input electrodes.

4. An apparatus according to claim 3, including a respective control electrode provided on each said array electrode, and two control terminals which are each electrically coupled to a respective one of said control electrodes.

5. A convolver according to claim 3, wherein said portions of each said array electrode are spaced from each other, are parallel, and extend approximately transversely of said propagation path.

6. A convolver according to claim 2, wherein said epitaxial layer is provided on said semiconductor layer, said insulating layer is provided on said epitaxial layer, and said piezoelectric film is provided on said insulating layer, said first and second array electrodes each being provided between said epitaxial layer and said insulating layer.

7. A convolver as recited in claim 6, including a rear side electrode provided on a side of said semiconductor layer remote from said epitaxial layer.

8. A convolution integrator comprising:

a surface acoustic wave convolver which includes:

a substrate including at least a piezoelectric film;

a pair of input electrodes disposed with a predetermined distance on said piezoelectric film;

a gate electrode for taking out a convolution output disposed on a propagation path of surface acoustic wave on said piezoelectric film between said pair of input electrodes; and loss controlling means for controlling propagation loss of the surface acoustic wave by electric signals, disposed on said piezoelectric film between said gate electrode and each of said input electrodes; and synchronizing means, which makes said loss controlling means change from a state where the loss is great to a state where the loss is small at the same time as the beginning point of the input signal and return again to the state where the loss is great, after a period of time of T+Td has lapsed;

T denoting the in-gate delay time, Td the delay time required for the surface acoustic wave to reach the closest end of said gate electrode, starting from the input electrodes;

the beginning point of the reference input signal being synchronized with beginning point of the input signal.

9. A convolution integrator comprising:

a surface acoustic wave convolver which includes:

a multi-layered substrate having a piezoelectric film/an insulating layer/a semiconductor layer;

a pair of input electrodes disposed with a predetermined distance on said piezoelectric film;

a gate electrode for taking out a convolution output disposed on a propagation path of surface acoustic wave on said piezoelectric film between said pair of input electrodes; and loss controlling means for controlling propagation loss of the surface acoustic wave by electric signals, disposed on said piezoelectric film between said gate electrode and each of said input electrodes; and synchronizing means, which makes said loss controlling means change from a state where the loss is great to a state where the loss is small at the same time as the beginning point of the input signal and return again to the state where the loss is great, after a period of time of T+Td has lapsed;

T denoting the in-gate delay time, Td the delay time required for the surface acoustic wave to reach the closest end of said gate electrode, starting from the input electrodes;

the beginning point of the reference input signal being synchronized with the beginning point of the input signal.

10. A convolution integrator comprising:

a surface acoustic wave convolver which includes:

a multi-layered substrate having a piezoelectric film/an insulating layer/a first conductivity type semiconductor epitaxial layer/a first conductivity type high impurity concentration semiconductor layer;

a pair of input electrodes disposed with a predetermined distance on said piezoelectric film;

a gate electrode for taking out a convolution output disposed on a propagation path of surface acoustic wave on said piezoelectric film between said pair of input electrodes;

two auxiliary electrodes each disposed on said piezoelectric film between said gate electrode and a respective one of said input electrodes; and an array electrode disposed under said insulating layer under each of said auxiliary electrodes;

bias supplying means for applying a bias voltage to said auxiliary electrodes; and synchronizing means, which makes said auxiliary electrodes change from a state where the loss is great to a state where the loss is small at the same time as the beginning point of the input signal and return again to the state where the loss is great, after a period of time T+Td has lapsed;

T denoting the in-gate delay time, Td the delay time required for the surface acoustic wave to reach the closest end of said gate electrode, starting from the input electrodes;

the beginning point of the reference input signal being synchronized with the beginning point of the input signal.

11. A convolution integrator comprising:

a surface acoustic wave convolver which includes:

a multi-layered substrate having a piezoelectric film/an insulating layer/a semiconductor layer:

a pair of input electrodes disposed with a predetermined distance on said piezoelectric film:

a gate electrode for taking out a convolution output disposed on a propagation path of surface acoustic wave on said piezoelectric film between said pair of input electrodes; and loss controlling means for controlling propagation loss of the surface acoustic wave by electric signals, said loss controlling means including two array electrodes each disposed on said piezoelectric film between said gate electrode and a respective one of said input electrodes;

two gate circuits each having an output coupled to a respective one of said input electrodes; and synchronizing means for controlling the state of the array electrodes and the gate circuits with respect to the input signal and the reference input signal for synchronizing them;

wherein, T denoting the in-gate delay time, Td the delay time required for the surface acoustic wave to reach the closest end of said gate electrode, starting from the input electrodes, when said input signal and said reference input signal are repeating signals having a period of T, said synchronizing means effects synchronizing control so that (i) the beginning of the period of the input signal, the beginning of the period of the reference signal, and the point of time of the change of the state of opening or closing of said gate circuit are synchronized;

(ii) the opening and closing of said gate circuit repeats the change of the state with a period of 2T, said gate circuit being in the opened state during a time width T, which is a half of one period, and in the closed state during the remaining time;

(iii) the state of the loss by the array electrodes repeats also the change of state with a period of 2T, it being in the state, where the loss is small, during a time width of T+Td and in the state, where the loss is great, during the remaining time width; and (iv) the point of time where the array electrodes are changed from the state, where the loss is great, to the state, where the loss is small, is synchronized with the point of time, where the gate circuit is changed from the closed state to the opened state.

* * * * *

UNITED STATES PATENT AND TRADEMARK OFFICE
CERTIFICATE OF CORRECTION

PATENT NO. : 5 043 620

DATED : August 27, 1991

INVENTOR(S) : Syuichi MITSUTSUKA

It is certified that error appears in the above-identified patent and that said Letters Patent is hereby corrected as shown below:

Column 12, line 42; replace "consisting of" with ---which includes---.

Column 12, line 61; replace "consisting of" with ---including---.

Signed and Sealed this

Twentieth Day of April, 1993

*Attest:*

MICHAEL K. KIRK

*Attesting Officer*

*Acting Commissioner of Patents and Trademarks*